United States Patent [19]

Crick

[11] Patent Number: 5,302,905
[45] Date of Patent: Apr. 12, 1994

[54] APPARATUS AND METHOD FOR DETECTING AND ISOLATING NOISE-CREATING IMBALANCES IN A PAIRED TELECOMMUNICATIONS LINE

[75] Inventor: Robert G. Crick, San Diego, Calif.

[73] Assignee: Tempo Research Corporation, Vista, Calif.

[21] Appl. No.: 949,438

[22] Filed: Sep. 23, 1992

Related U.S. Application Data

[63] Continuation-in-part of Ser. No. 671,045, Mar. 18, 1991, Pat. No. 5,157,336.

[51] Int. Cl.$^5$ ..................... G01R 31/02; G01R 31/08
[52] U.S. Cl. ............................. 324/613; 324/523; 324/539; 324/612
[58] Field of Search ............... 324/522, 523, 524, 527, 324/528, 539, 612, 613; 379/21, 24, 26, 30

[56] References Cited

U.S. PATENT DOCUMENTS 4,278,931 7/1981 Huggins ............................. 324/523

OTHER PUBLICATIONS

The Institute of Electrical and Electronics Engineers, Inc., "IEEE Standard Test Procedure for Measuring Longitudinal Balance of Telephone Equipment Operating in the Voice Band", ANSI/IEEE St 455-1985, Jul. 25, 1985.
Wilcom Products, Inc., "Model T279 Circuit Termination Set" Dec. 1983.
Wilcom Products, Inc., "Model T207 Longitudinal Balance Test Set" Apr. 1983.
Wilcom Products, Inc., "Model T279 Circuit Terminating Set Operating Instructions", Issue 2, May 1990.
Wilcom Products, Inc., "Instruction Manual Model T207 Longitudinal Balance Test Set", Issue 1, Nov. 1977.

*Primary Examiner*—Gerard R. Strecker
*Assistant Examiner*—Diep Do

[57] ABSTRACT

A device for measuring and isolating noise-creating imbalances in a paired telecommunications line has an internal circuit which includes a pair of substantially balanced ac current outlet pathways and a pair of high voltage bias pathways in parallel. An oscillator in the circuit generates a low voltage longitudinal ac signal that is transmitted across the balanced pathways and a dc power source simultaneously generates a high voltage dc signal that is transmitted across the high voltage bias pathways. Both signals are further transmitted to the paired line where it is the function of the high voltage dc signal to punch through any concealed faults in the line. In contrast, the low voltage ac signal travels the length of each conductor in the line and returns to the circuit as a metallic voltage signal. If there is any imbalance between the two conductors, the metallic voltage signals for the two conductors will be different. Accordingly, a differential amplifier in the circuit measures this difference and displays it in units of noise or balance.

16 Claims, 2 Drawing Sheets

APPARATUS AND METHOD FOR DETECTING AND ISOLATING NOISE-CREATING IMBALANCES IN A PAIRED TELECOMMUNICATIONS LINE

This application is a continuation-in-part patent application of my prior co-pending patent application entitled, "Noise Measurement In a Paired Telecommunications Line," Ser. No. 07/671,045, filed on Mar. 18, 1991 now U.S. Pat. No. 5,157,336.

FIELD OF THE INVENTION

The present invention relates generally to detection of noise in a paired line. More particularly the present invention relates to an apparatus and method for measuring noise in a paired telecommunications line. The present invention is particularly, though not exclusively, an apparatus and method for detecting and isolating noise-creating imbalances in a paired line of a telecommunications cable by means of a balanced circuit.

BACKGROUND OF THE INVENTION

Paired lines are a conventional means of carrying telecommunications transmissions. A paired line is made up of two balanced conductors individually insulated and twisted together. Paired lines are typically bunched together in a cable termed a paired cable, which contains up to one hundred or more paired lines, wherein each paired line is capable of independently carrying telecommunications signals. Paired lines are generally effective telecommunications carriers. However, it is not unusual for noise to occur in paired lines which is extremely disruptive to the clarity of the transmitted signal.

When noise is reported in a paired telecommunications line, correction of the condition requires confirming the presence of the noise in the line by measuring its level and then isolating and locating the noise source for purposes of eliminating it. Presently known methods for performing these tasks are to simply tap into the line and either listen for the noise on a handset or measure the noise level with a passive noise measurement set. However, both of these methods draw dc loop current from the paired line in order to operate. The flow of dc loop current from the paired line into the detection device tends to seal any noise-causing faults in the line, rendering the faults essentially undetectable. Consequently, the noise will continue to be apparent to a line user, but the noise source will elude detection and repair.

There are a wide range of noise sources for which detection is desirable since virtually any condition which can cause an imbalance between two conductors of a paired line can result in noise. Among the causes are series resistance faults, shunt resistance faults, cross faults, shunt capacitance faults, unbalanced series inductance, and power influence. Series resistance faults occur when there is an open in a line, often resulting from a corroded joint. Shunt resistive faults occur when another body grounds a paired line. Cross faults occur when there is communication between adjacent paired lines in a cable. Shunt capacitance faults occur when one conductor of a pair is slightly longer than the other conductor, and the longer conductor possesses a higher capacitance to ground than the shorter conductor. Unbalanced series inductance occurs when only one half of a load coil is connected to a paired line at some point along the length of the line. Power influence is induced voltage from an ac power source adjacent the paired line. Unlike the above-recited causes of imbalance, power influence imbalance can occur even when the paired line is free of faults and appears balanced in the absence of the power influence.

Power influence, which as noted above is induced voltage from line to ground, most commonly occurs when the paired line is near a power line. In the United States, the power line frequency is typically 60 Hz, but power influence can likewise result from other power line frequencies, including 50 Hz, as typically found in many other parts of the world. Power influence can create unique problems for noise detection when it occurs in conjunction with a fault. For example, a series resistance fault may only produce a high level of noise when accompanied by a high power influence. Therefore, a noise caused by the fault may be observed by a user at a time of high power demand on a nearby power line, but when a repairman is dispatched to the site, the power demand and correspondingly the power influence may have diminished so that the noise resulting from the fault alone is no longer detectable by conventional detection devices. Accordingly, such a fault is very difficult to locate and repair.

Another detection problem which occurs when power influence is present in conjunction with a fault results from the fact that power influence signals often do not create large longitudinal current flow. Such flow is necessary to detect series resistance faults because longitudinal current flow through a series resistance fault produces a voltage imbalance in the paired line which can be measured metallically. However, because conventional passive detection devices lack the ability to independently generate longitudinal current flow, they accordingly may fail to detect such faults where power influence is relied upon to generate longitudinal current flow.

As such, it is apparent that a need exists for a reliable noise measurement device which provides more certainty of noise detection on a paired line than do existing devices. Specifically, a noise measurement device is needed which can detect noise on a paired line from a wide range of sources and in particular from series resistance faults and power influence even at times of low power demand. A noise measurement device is needed which does not modify or obscure the noise signal on the paired line when the device is introduced into a loop containing the noisy line. A noise measurement device is needed which can independently generate longitudinal current flow when necessary in the paired line being tested. Further, a noise measurement device is needed which can effectively locate noise sources on the paired line when it is working, i.e., wet, as well as when it is non-working, i.e., dry.

SUMMARY OF THE INVENTION

The present invention is an apparatus and method for measuring noise in a paired line and more particularly for detecting and isolating noise-creating imbalances in a paired telecommunications line. The detection device of the present invention is a self-contained field-portable unit comprising a housing containing an internal measuring circuit and a plurality of external leads connected to the circuit and extending from the housing. The plurality of leads includes a pair of measuring leads and a ground lead. Each of the two measuring leads has a contact on its external end which is electrically connectable to a first and a second conductor respectively of the paired line to provide electrical communication between the paired line and the internal circuitry of the device.

The internal circuit comprises a pair of substantially balanced ac current outlet pathways which extend in parallel from an ac current source. In a preferred embodiment, balance is achieved by providing a corresponding balanced resistor in each balanced outlet pathway. The internal circuit further comprises a differential amplifier which is connected to the measuring leads across a pair of voltage inlet pathways. The ac current source is an oscillator which supplies longitudinal alternating current to the conductors of the paired line across the balanced outlet pathways and leads. A ground pathway is connected to the oscillator and provides an earth ground for the device across the ground lead. A display is provided to visually display the output signal of the differential amplifier as a meaningful noise or balance measurement. Operating power for the device is provided by a direct current battery.

In operation, the present invention has one of two preferred modes, an active mode and a passive mode which are specific to the detection of different types of paired line imbalances. Most common fault-caused imbalances which result in noise are detectable in the active mode wherein a low voltage longitudinal alternating current signal from the oscillator is split and sent to each conductor of the paired line across the balanced outlet pathways. The conductors receive the substantially identical split signals which then travel the length of each conductor and return to the measuring device as a given voltage. If there is any imbalance between the two conductors, metallic voltage signals will be generated which will be different between the two conductors. Accordingly, the voltage inlet pathways will receive the different voltages from the two conductors and feed the voltages to the differential amplifier which measures the level of difference. This voltage difference is displayed to the operator in units of noise or balance.

The balanced outlet pathways are further provided with capacitors which function to substantially prevent or minimize the amount of dc loop current drawn from the paired line by the device when the line is live and operational within a loop. It is desirable to prevent the device from drawing direct current from the operational loop because such current will seal faults in the line, particularly series resistance faults, and impair their detection. Thus, the dc blocking capacitors are selected to perform this function and are further selected in correspondence with the balanced resistors such that a substantially identical balance is maintained between the balanced outlet pathways. The ground pathway is also provided with a capacitor which acts as a high impedance to ground to substantially prevent or minimize low frequency ac power influence current flow to ground. Like dc loop current, if power influence current is drawn through a fault, it undesirably tends to seal the fault.

It is important to note that because the present device provides its own low voltage alternating current for testing in the active mode, it does not rely on the operating dc current of the loop being tested and accordingly is applicable to testing either wet or dry paired lines. The ability to generate its own alternating test current also avoids the problems encountered in known passive noise detection devices which must rely on the power influence signal to excite the fault. Nevertheless, when the passive mode of operation is desirable in the present invention, it can be performed in a manner substantially similar to the active mode. However, in the passive mode the low voltage ac signal is not sent to the paired line. Instead, the voltage inlet pathways receive line voltages generated directly by power influence which are in turn used to measure noise in the line. The passive mode utilizes substantially the same circuitry as the active mode absent the oscillator.

Use of the present invention for detection of imbalances and measurement of noise has been demonstrated above. The invention has further application for locating or isolating sources of imbalance on a paired line. Source isolation is performed by placing the device on the line and transmitting a low voltage longitudinal ac signal in either direction through the paired lines. If an imbalance is detected, the device is repositioned on the line downstream of the first testing point and the line is retested in both directions from the new position. As can be seen, the source can be located in this manner by iteratively repositioning the device on the line about the source until the source is isolated within a narrow section of line.

The present invention is particularly applicable to the detection or isolation of noise-creating imbalances in paired telephone lines. This application is enhanced by incorporating a pair of high voltage bias pathways into the internal circuit of the device of the present invention. The high voltage bias pathways provide electrical communication between a grounded high voltage power source and the balanced outlet pathways described above.

During operation, each high voltage bias pathway supplies a high voltage dc signal from the dc power source across high value resistors positioned along the high voltage bias pathway to each balanced outlet pathway. From the balanced outlet pathway, the high voltage dc signal is transmitted to each conductor of the paired line simultaneous with the transmission of the low voltage longitudinal ac signal generated by the oscillator. As commonly occurs at a fault in a paired telecommunications line that is inactive for any period of time, the fault can be concealed by galvanic action, thereby rendering the fault undetectable by the low voltage ac signal alone. The high voltage dc signal delivered by the high voltage bias pathway of the present invention, however, has sufficient strength to punch through the galvanic layer at the fault, thereby exposing the fault to detection by the low voltage ac signal in the manner described above. The high value resistors serve to prevent the high voltage dc signal from disrupting the sensitive imbalance detection function of the device.

The device of the present invention is portable and self-contained such that it can be easily and effectively operated in remote field locations without additional supporting equipment. The device has a long range, i.e., on the order of about 20 miles or more, so that it can be used to test a line at nearly any point on the line. Noise measurements can be performed simply by bridging the line without breaking it. The line need only be broken if it is subsequently desired to isolate a source of imbalance. The invention is adaptable to operating at a number of different frequency and noise reference levels including the conventional C-message frequency band and the maximum power influence level (90 dB reference noise) used by the telephone industry. The invention is capable of reliably detecting noise created in a paired line from several types of imbalance sources including series resistance faults, shunt resistance faults, cross faults, shunt capacitance faults, unbalanced series inductance, and power influence. In sum, the present invention provides highly sensitive instantaneous readings of noise.

The novel features of this invention, as well as the invention itself, both as to its structure and its operation, will be best understood from the accompanying drawings, taken similar reference characters refer to similar parts, and in which:

DESCRIPTION OF PREFERRED EMBODIMENTS

The present invention is described below in the preferred embodiments with reference to a paired telephone line. However, it is understood that the invention is applicable to substantially any paired line and more particularly to a paired telecommunications line. It is further understood that the present invention is applicable to a paired line in isolation or to a paired line contained within a paired cable.

Figure 1:
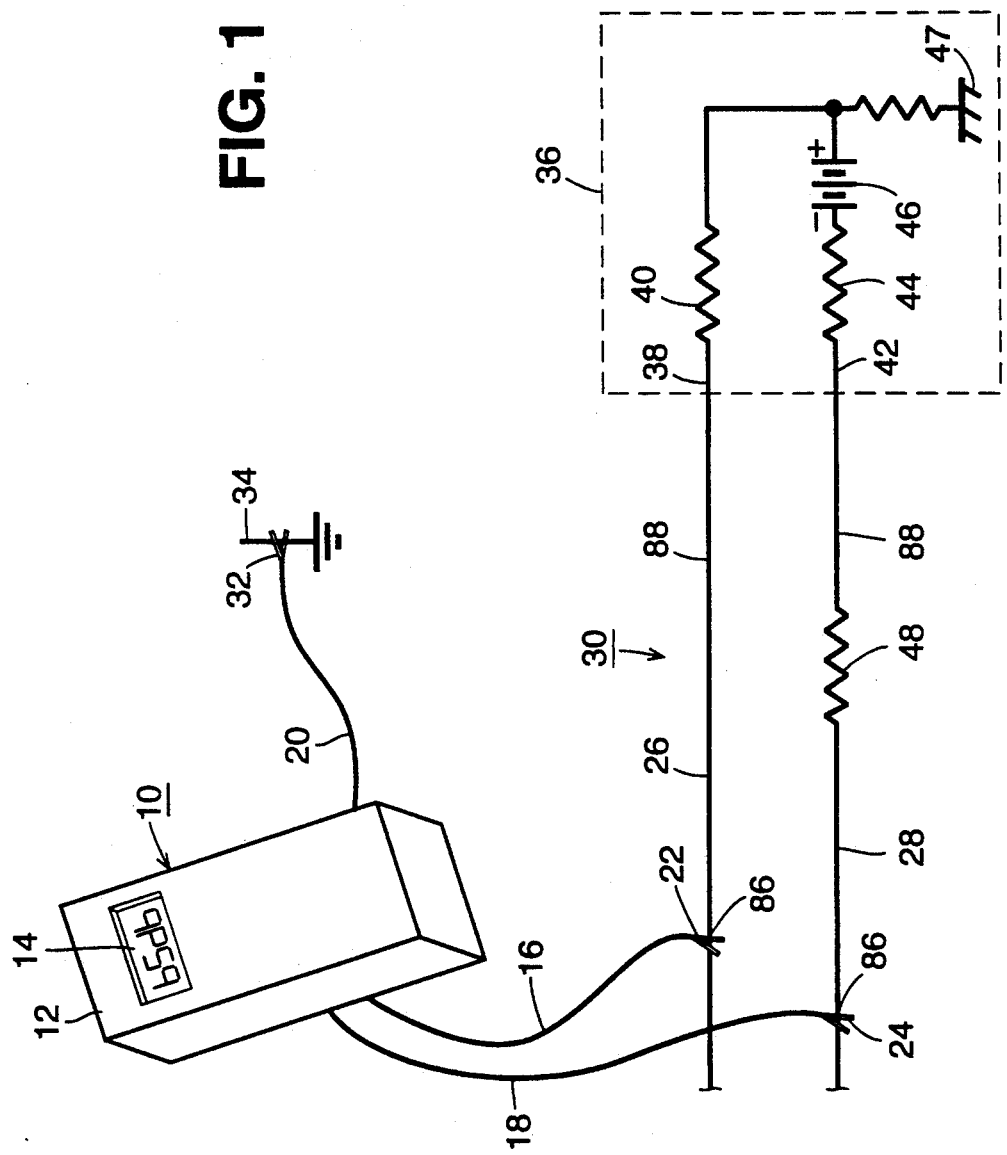
FIG. 1 is a perspective of the present invention shown connected to a schematically depicted telephone system having a paired line.

Referring first to FIG. 1, the noise measuring device is shown and generally designated 10. The internal circuit of device 10 is not shown in FIG. 1, but is contained within housing 12. A display 14, such as a liquid crystal display, is provided through housing 12 for visually displaying measured noise or balance values to an operator. Leads 16, 18, 20 are wires extending exteriorly from housing 12. Leads 16, 18 are first and second measuring leads respectively and are in electrical communication with first and second balanced outlet pathways as well as first and second voltage inlet pathways which are described below with reference to FIG. 2.

With continuing reference to FIG. 1, the external ends of first and second measuring leads 16, 18 have first and second contacts 22, 24 affixed thereto. First and second contacts 22, 24 are removably engagable with first and second conductors 26, 28 respectively of the paired line designated generally as 30. Ground lead 20 also has a ground contact 32 affixed to its external end which is removably engagable with an earth ground 34. Contacts 22, 24, 32 are preferably conventional alligator clips which are toothed and spring biased to make good electrical contact upon engagement with conductors 26, 28 or ground 34 and yet are easily removable for repositioning.

Figure 2:
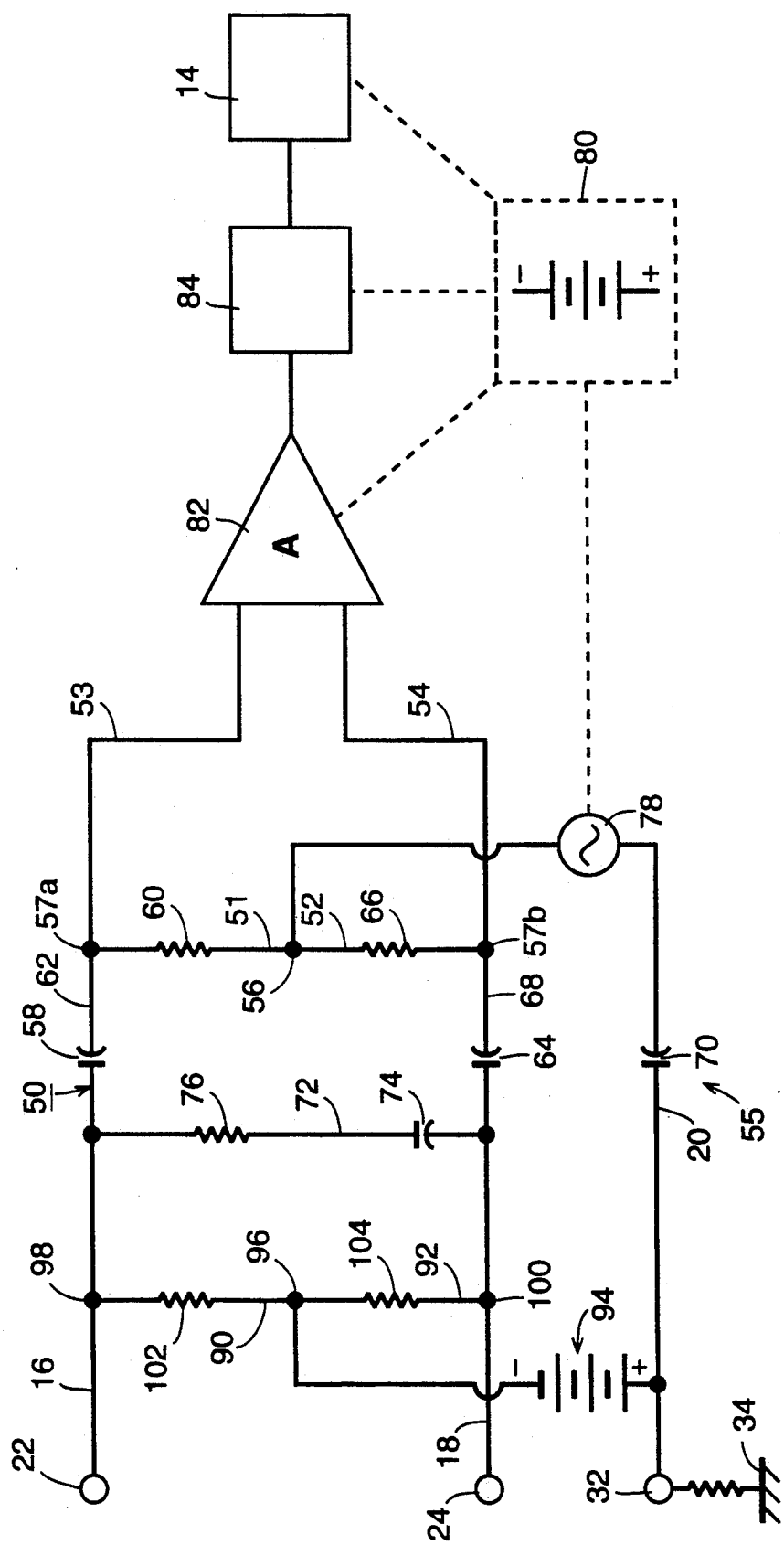
FIG. 2 is a diagram of the circuitry of the present invention.

First and second conductors 26, 28 typically terminate at a central telephone office 36. Central telephone offices are generally characterized as having balanced input circuits, i.e., balanced impedance to ground. Central office 36 shown in FIG. 2 is representative of such offices, wherein balanced circuits are provided by a first terminal 38 having a resistor 40 and a second terminal 42 having an equal resistor 44. Terminal 42 further has a direct current battery 46 in series. Both terminals 38, 42 lead to ground 47. Battery 46 supplies the operating current to the telephone loop which is defined by paired line 30. The telephone operating current is typically 48 volts dc.

A series resistance fault 48 is shown on second conductor 28 which creates an imbalance in paired line 30 between first and second conductor 26, 28. It is understood that fault 48 is illustrative of any number of sources of imbalance in paired line 30 to which the present invention is applicable, additionally including shunt resistance faults, cross faults, shunt capacitance faults, unbalanced series inductance, and power influence. An imbalance is essentially any fault or upset in conductors 26, 28 or conductors connected thereto which creates a voltage differential between conductors 26, 28 and results in noise in paired line 30.

Referring now to FIG. 2, the internal circuit of device 10 is shown and generally designated 50. Internal circuit 50 comprises a first balanced outlet pathway 51, a second balanced outlet pathway 52, a first voltage inlet pathway 53, a second voltage inlet pathway 54, and a ground pathway 55. Balanced outlet pathways 51, 52 run from oscillator 78 to contacts 22, 24 respectively, splitting at node 56. Voltage inlet pathways 53, 54 run from a differential amplifier 82, described hereafter, to contacts 22, 24. Although balanced outlet pathways 51, 52 and voltage inlet pathways 53, 54 are shown sharing common lines from nodes 57a, 57b to contacts 22, 24 respectively, it is understood that wholly independent lines could be provided for voltage inlet pathways 53, 54 from differential amplifier 82 to contacts 22, 24 within the scope of the present invention.

First inlet and outlet pathways 51, 53 are connected to contact 22, shown schematically, across lead 16. Second inlet and outlet pathways 52, 54 are likewise connected to contact 24 across lead 18. First balanced outlet pathway 51 has a first dc blocking capacitor 58 and a first balancing resistor 60 forming a first resistor-capacitor couplet 62, while second balanced outlet pathway 52 has a second dc blocking capacitor 64 and a second balancing resistor 66 forming a second resistor-capacitor couplet 68. Capacitors 58, 64 and resistors 60, 66 are selected in a manner known to one skilled in the art such that first balanced outlet pathway 51 is substantially balanced with second balanced outlet pathway 52. Ground circuit 55 comprises ground capacitor 70 and lead 20 going to earth ground 34 across contact 32. Where outlet pathways 51, 52 and inlet pathways 53, 54 occupy wholly independent lines, first and second couplets 62, 68 are positioned on balanced outlet pathways 51, 52 exclusively.

A terminating pathway 72 may be provided between pathways 51, 53 and pathways 52, 54. Terminating pathway 72 has a dc isolating capacitor 74 and a line terminating resistor 76 which has a resistance substantially equal to the line terminating resistance of conductors 26, 28. An oscillator 78 is provided which is a low voltage alternating current source feeding into conductors 26, 28 across balanced ac current outlet pathways 51, 52. Low voltage ac is defined herein as preferably being less than about 10 volts. Operating power is provided to oscillator 78 by a dc power source 80 which is preferably a conventional 9 volt dc battery shown functionally connected to oscillator 78.

A pair of high voltage bias pathways 90, 92 and a dc power source 94 are also provided in internal circuit 50 downstream of terminating pathway 72. Although dc power source 94 is shown schematically to be separate from dc power source 80 and may be in the form of a conventional 150 volt dc battery, it is apparent that dc power sources 80 and 94 may be provided by a single dc power source, such as a conventional 9 volt battery, wherein a power converter (not shown) is provided to generate a high voltage dc signal therefrom for delivery to high voltage bias pathways 90, 92. In any event, dc power source 94 is connected at its positive terminal to ground lead 20. First and second high voltage bias pathways 90, 92 run from the negative terminal of dc power source 94 and split at node 96 to individually engage first and second balanced outlet pathways 51, 52 at nodes 98, 100, respectively. Each high voltage bias pathway 90, 92 contains a high value resistor 102, 104, respectively. Resistors 102, 104 are preferably identical and each has a resistance within a range of about 20,000 ohms to about 2 megohms, and preferably within a range of about 0.5 megohms to about 1.5 megohms.

Circuit 50 is further provided with a measuring means in the form of a differential amplifier 82 which is in electrical communication with first and second voltage inlet pathways 53, 54. Differential amplifier 82 receives metallic voltage signals from voltage inlet pathways 53, 54 and measures the voltage difference. These differences are converted to a corresponding expression of noise or balance and fed to display 14. A log amplifier 84 may be provided for converting the voltage difference from amplifier 82 to a measure of noise in decibels, typically in units of decibels reference noise (dBrn), or a measure of balance also in decibels. Amplifiers 82, 84 and display 14 are powered by battery 80.

METHOD OF OPERATION

With cross-reference to FIGS. 1 and 2, operation of device 10 may be seen. The presence of oscillator 78 indicates that device 10 is operable in the active mode. The passive mode, however, can also be provided simply by deactivating or removing oscillator 78 from circuit 50 to eliminate the internally generated ac signal. The passive mode parallels the active mode in the other respects of operation.

The active mode is initiated by connecting contacts 22, 24 to conductors 26, 28 respectively and sending a low voltage longitudinal alternating current signal from oscillator 78 to each conductor 26, 28 across balanced ac current outlet pathways 51, 52. Since pathways 51, 52 are substantially balanced, the resulting split signal received by each of conductors 26, 28 is substantially identical.

A high voltage dc signal is simultaneously delivered along with the low voltage ac signal to conductors 26, 28 by deployment of high voltage bias pathways 90, 92. A high voltage dc signal is defined herein as having a voltage of at least about 50. The high voltage dc signal is generated by dc power source 94 and passes through high value resistors 102, 104 of high voltage bias pathways 90, 92, respectively, before reaching conductors 26, 28. The high voltage dc signal continues to travel along conductors 26, 28 until it encounters a fault, such as fault 48 of conductor 28. The dc signal punches through any galvanic coating which may surround fault 48, thereby exposing fault 48 to enable accurate detection thereof in the manner described hereafter.

The ac current signal simultaneously proceeds along conductors 26, 28 to the central telephone office 36 where it is shunted to ground through balanced resistors 40, 44. Alternatively, if the signal is sent along a dry line, the signal current is shunted to ground by conductor capacitance along the line length. It is noted that the utilization of high voltage bias pathways 90, 92 is most effective for the detection of shunt resistance or cross faults in paired lines that are dry, i.e., paired lines that are not connected to the central office 36. In any case, the voltage drop due to the ac current flow through the impedance of each conductor 26, 28 is reflected back to voltage inlet pathways 52, 54 in the form of discrete metallic voltage signals from each conductor 26, 28.

The added resistance at fault 48 of second conductor 28 creates an imbalance in the metallic voltage signals between conductors 26, 28. Voltage inlet pathways 53, 54 receive the two different voltage signals and feed them to differential amplifier 82 which measures the difference. This voltage difference is converted by log amplifier 84 to units of noise or balance for display 14 resulting in an accurate noise or balance measurement.

Capacitors 58, 64 isolate circuit 50 from dc loop current by substantially preventing or minimizing the amount of dc loop current drawn from paired line 30. As noted, under some circumstances it is desirable to prevent device 10 from drawing direct current from the operational loop because such current can seal fault 48 and impair its detection. Capacitor 70 of ground circuit 55 acts to block flow of low frequency ac current resulting from power influence to ground. In the absence of ac blocking capacitor 70, ground circuit 55 could draw sufficient ac power influence current to ground to undesirably seal fault 48. Accordingly, capacitor 70 substantially prevents or minimizes the low frequency ac power influence current as well as the dc loop current drawn by ground circuit 55.

Sources of imbalance or noise, such as fault 48, are isolated and located on paired line 30 by placing contacts 22, 24 on line 30 at point 86, as shown. An imbalance will be detected by device 10 as a difference between the metallic voltage signals of conductors 26, 28 when the longitudinal alternating current signal is sent in the direction of central office 36. Contacts 22, 24 are then repositioned at second point 88 on line 30 downstream of first testing point 86. Line 30 is retested in both directions from point 88. Noise will be measured on line 30 in the direction away from office 36, but not in the direction toward office 36. Thus, it is apparent that fault 48 is between points 86 and 88. Fault 48 can be located with greater precision in this manner by iteratively repositioning contact 22, 24 on line 30 about fault 48 until it is isolated within a narrow section of line.

Although not shown in the drawings, it is apparent to one skilled in the art that circuit 50 of FIG. 2 can be supplemented with additional measuring means well known in the art to make quantitative measurements other than those described above from signals received by device 10 during operation. Thus, for example, circuit 50 can be supplemented with ac and dc volt and ohm meter circuitry to quantify line resistance problems on paired line 30 or voltage leakage to another line. Similarly, loop milliamp meter circuitry can be provided to quantify series resistance in paired line 30. Loss measurement circuitry can be provided to quantitatively measure loss in units of decibels along paired line 30 from an ac voltage source at central office 36 to a remote point on the line 30. Power influence voltage measurement circuitry can be provided to quantify the amount of voltage between either conductor 26, 28 of paired line 30 and ground.

While the particular means of noise measurement in a paired telecommunications line as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

I claim:

1. An apparatus for measuring noise in a paired line comprising:
   a first contact engagable with a first conductor of said line;
   a second contact engagable with a second conductor of said line;
   measuring means in electrical communication with said first and second contacts for measuring metallic voltage signals generated by an imbalance between said first conductor and said second conductor representative of a noise in said line;
   a first voltage inlet pathway across which said measuring means electrically communicates with said first contact;
   a second voltage inlet pathway across which said measuring means electrically communicates with said second contact;
   a first balanced pathway in electrical communication with said first contact;
   a second balanced pathway in electrical communication with said second contact, said first balanced pathway substantially electrically balanced with said second balanced pathway;
   an alternating current source electrically connected to said first contact across said first balanced pathway and to said second contact across said second balanced pathway to provide an alternating current signal to said paired line; and
   a first high voltage bias pathway in electrical communication with said first contact;
   a second high voltage bias pathway in electrical communication with said second contact;
   a direct current source electrically connected to said first contact across said high voltage bias pathway and to said second contact across said second high voltage bias pathway to provide a direct current signal to said paired line.

2. An apparatus for measuring noise in a paired line as recited in claim 1 wherein said first high voltage bias pathway is provided with a first high value resistor and said second high voltage bias pathway is provided with a second high value resistor.

3. An apparatus for measuring noise in a paired line as recited in claim 2 wherein said first and second high value resistors have a resistance within a range of about 20,000 ohms to about 2 megohms.

4. An apparatus for measuring noise in a paired line as recited in claim 2 wherein said first and second high value resistors have substantially equal resistances.

5. An apparatus for measuring noise in a paired line as recited in claim 1 wherein said direct current signal has a voltage of at least about 50 volts.

6. An apparatus for measuring noise in a paired line as recited in claim 1 wherein said alternating current signal has a voltage of less than about 10 volts.

7. An apparatus for measuring noise in a paired line comprising:
   a first contact engagable with a first conductor of said line;
   a second contact engagable with a second conductor of said line;
   measuring means in electrical communication with said first and second contacts for measuring metallic voltage signals generated by an imbalance between said first conductor and said second conductor representative of a noise in said line;
   a first voltage inlet pathway across which said measuring means electrically communicates with said first contact;
   a second voltage inlet pathway across which said measuring means electrically communicates with said second contact;
   a first balanced pathway in electrical communication with said first contact;
   a second balanced pathway in electrical communication with said second contact, said first balanced pathway substantially electrically balanced with said second balanced pathway;
   first minimizing means in said first balanced pathway for substantially minimizing dc loop current drawn by said first balanced pathway from said first conductor.
   a first high voltage bias pathway in electrical communication with said first contact, said first high voltage pathway having a first high value resistor positioned therein;
   a second high voltage bias pathway in electrical communication with said second contact, said second high voltage pathway having a second high value resistor positioned therein;
   a direct current source electrically connected to said first contact across said high voltage bias pathway and to said second contact across said second high voltage bias pathway to provide a direct current signal to said paired line.

8. A method for measuring noise in a paired line comprising:
   transmitting a direct current signal through a first conductor and a second conductor of said paired line, wherein said first conductor has a fault having a galvanic coating and said direct current signal is sufficient to substantially penetrate said galvanic coating;
   generating a first metallic voltage signal in a first conductor of said paired line and a second metallic voltage signal in a second conductor of said paired line, wherein said first and second conductors have an imbalance caused by said fault;
   transmitting said first and second metallic voltage signals to a substantially balanced circuit; and
   measuring a differential between said first and second metallic voltage signals caused by said imbalance between said first and second conductors representative of a noise in said line.

9. A method for measuring noise in a paired line as recited in claim 8 further comprising minimizing dc loop current drawn by said circuit from said first and second conductors.

10. A method for measuring noise in a paired line as recited in claim 8 further comprising transmitting a longitudinal alternating current signal in parallel from an alternating current source across said balanced circuit and into said first and second conductors to generate said first and second metallic voltage signals.

11. A method for measuring noise in a paired line as recited in claim 10 further comprising connecting said alternating current source to a ground and minimizing flow of power influence across said circuit to said ground.

12. A method for measuring noise in a paired line as recited in claim 8 wherein said direct current signal has a voltage of at least about 50 volts.

13. A method for measuring noise in a paired line as recited in claim 10 wherein said alternating current signal has a voltage less than about 10 volts.

14. A method for measuring noise in a paired line as recited in claim 8 wherein said direct current signal is transmitted to said first and second conductors of said paired line across a first high value resistor and a second high value resistor positioned in parallel.

15. A method for measuring noise in a paired line as recited in claim 14 wherein said first and second high value resistors have a resistance within a range between about 20,000 ohms and about 2 megohms.

16. A method for measuring noise in a paired line as recited in claim 8 further comprising generating said high voltage direct current signal by means of a direct current battery.

* * * * *